(12) United States Patent
Choi et al.

(10) Patent No.: US 6,586,154 B1
(45) Date of Patent: Jul. 1, 2003

(54) PHOTORESIST POLYMERS AND PHOTORESIST COMPOSITIONS CONTAINING THE SAME

(75) Inventors: Jae Hak Choi, Kyoungki-do (KR); Chang Il Choi, Kyoungki-do (KR); Hak Joon Kim, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 47 days.

(21) Appl. No.: 09/686,549

(22) Filed: Oct. 11, 2000

(30) Foreign Application Priority Data

Oct. 11, 1999 (KR) .............................. 99-43844

(51) Int. Cl.[7] .............................................. C08G 64/00
(52) U.S. Cl. ................... 430/270.1; 430/905; 430/913; 430/320; 430/322; 430/330; 528/196; 528/370; 558/264
(58) Field of Search ............................. 430/270.1, 905, 430/913, 320, 322, 330; 528/370, 196; 558/264

(56) References Cited

U.S. PATENT DOCUMENTS

| | | | | |
|---|---|---|---|---|
| 3,579,607 A | * | 5/1971 | Matzner et al. | 260/824 |
| 3,631,200 A | * | 12/1971 | Nehring et al. | 558/265 |
| 4,950,736 A | | 8/1990 | Sasaki et al. | 528/370 |
| 5,141,832 A | * | 8/1992 | Takegawa et al. | 430/96 |
| 5,264,312 A | * | 11/1993 | Stolka et al. | 430/130 |
| 5,399,452 A | * | 3/1995 | Takegawa et al. | 430/58 |
| 5,853,952 A | * | 12/1998 | Ushirogouchi et al. | 430/270.1 |
| 6,103,447 A | * | 8/2000 | Chen et al. | 430/270.1 |
| 6,136,946 A | * | 10/2000 | Yao et al. | 528/196 |

FOREIGN PATENT DOCUMENTS

| | | | | |
|---|---|---|---|---|
| GB | 1169072 | 10/1969 | | |
| GB | 1298444 | 12/1972 | | |
| GB | 2355267 A | * 4/2001 | | C08G/64/02 |

(List continued on next page.)

OTHER PUBLICATIONS

WPI Accession No. 2000–101290[09] & JP 11338148 (Oki).
WPI Accession No. 1998–014805[02] & JP 9278874 (Sumitomo).
WPI Accession No. 1994–338359[42] & JP 6263860 (Chisso).
WPI Accession No. 1994–039879[05] & JP 5345388 (Kuraray).
WPI Accession No. 1990–250091[33] & JP 2173953 (Kuraray).

Primary Examiner—Rosemary Ashton
Assistant Examiner—Yvette C. Thornton
(74) Attorney, Agent, or Firm—Townsend and Townsend and Crew LLP

(57) ABSTRACT

The present invention discloses a photoresist polymer of following formula 1, and a photoresist composition comprising the same:

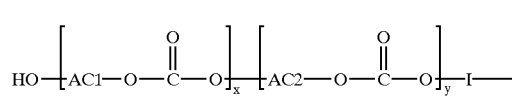

where AC1, AC2, x and y are those defined herein. The photoresist composition has excellent transparency in deep ultraviolet region, etching resistance and heat resistance, and can form a good pattern without a developing step. Accordingly, the photoresist composition can be applied to a high density minute pattern below 0.15 μm (e.g., for fabrication of DRAM over 1G), and efficiently employed for the lithography process using ArF, KrF, VUV, EUV, E-beam and X-ray.

22 Claims, 1 Drawing Sheet

FOREIGN PATENT DOCUMENTS

| | | | | |
|---|---|---|---|---|
| JP | 63267596 A | * | 11/1988 | ........... B41M/5/26 |
| JP | 02173953 A | * | 7/1990 | ........... G11B/7/24 |
| JP | 05155998 A | * | 6/1993 | ........... C08G/64/06 |
| JP | 05345388 A | * | 12/1993 | ........... B32B/15/08 |
| JP | 06179743 A | * | 6/1994 | ........... C08G/64/10 |
| JP | 06256495 A | * | 9/1994 | ........... C08G/64/06 |
| JP | 06263860 A | * | 9/1994 | ........... C08G/64/02 |
| JP | 06340802 A | * | 12/1994 | ........... C08L/69/00 |
| JP | 07018067 A | * | 1/1995 | ........... C08G/63/64 |
| JP | 09278874 A | * | 10/1997 | ........... C08G/64/02 |
| JP | 11147947 A | * | 6/1999 | ........... C08G/64/02 |
| JP | 11338148 A | * | 12/1999 | ........... G03F/7/039 |

* cited by examiner

Fig.1

PHOTORESIST POLYMERS AND PHOTORESIST COMPOSITIONS CONTAINING THE SAME

BACKGROUND OF THE INVENTION

1. Field of the Invention

The present invention relates to photoresist polymers and photoresist compositions containing the same. In particular, the present invention relates to polycarbonate photoresist polymers and photoresist compositions comprising the same that are suitable for photolithography processes employing KrF, ArF, VUV, EUV and similar light sources.

2. Description of the Background Art

Recently, chemical amplification-type DUV photoresists have been investigated in order to increase sensitivity in minute image formation processes for preparing semiconductor devices. Such photoresists are prepared by blending a photoacid generator and matrix resin polymer having an acid labile group.

In a photolithography process, an exposure of photoresist to light of a particular wavelength generates an acid from the photoacid generator that is present in the photoresist. The photo generated acid causes the main chain or the branched chain of the resin to decompose or become cross-linked. In addition, the acid removes the acid labile group and changes the polarity of the photoresist in the exposed region. This polarity change creates a solubility difference between the exposed portion and the unexposed portion in a developing solution, thereby allowing a pattern formation. The resolution of the pattern that is formed depends on the wavelength of the light source, i.e., in general, a shorter wavelength allows formation of more minute patterns.

In general, a useful photoresist (hereinafter, abbreviated as "PR") has a variety of desired characteristics, such as excellent etching resistance, heat resistance and adhesiveness. In addition, a photoresist should be easily developable in a commercially readily available developing solution, such as 2.38 wt % aqueous tetramethylammonium hydroxide (TMAH) solution. However, it is very difficult to synthesize a photoresist polymer that satisfies all of these requisites.

To solve some of the problems described above, there have been much research done on a resin having the high transparency at the wavelength of 193 nm and dry etching resistances similar to a Nobolac resin used in an i-line, for example, IBM has developed the following methacrylate copolymer resin of formula 2:

wherein, $R_1$, $R_2$ and $R_3$ are independently H or $CH_3$.

In the resin of formula 2, the ratio of "x" must be increased in order to improve the dry etching resistance. However, if the amount of "x" is increased, hydrophilicity of the resin itself is reduced, therefore a minute pattern may fall down. In order to overcome such a disadvantage, hydrophilic monomers such as a methacrylic acid are copolymerized. However, in this case, a photoresist top loss may occur, and thus a special developing solution such as a diluted solution or a solution containing isopropylalcohol must be employed, instead of the currently used developing solution. In addition, if the resin does not contain a predetermined degree of the alicyclic compounds, it cannot satisfy the etching resistance.

On the other hand, photoresists of formulas 3 and 4 comprising polycarbonate have been developed. The resin of formula 3 is not a chemical amplification resist, and thus has inferior sensitivity and throughput. Accordingly, a large quantity of photoacid generator must be used. In addition, the resin comprises wholly aromatic compounds, and thus has poor optical transmissivity in the wavelength of 193 nm. As a result, the resin cannot be employed for the ArF lithography process. The resin of formula 4 can be utilized as the chemical amplification resist, and thus has excellent sensitivity. However, it also contains wholly aromatic compounds, and thus has poor optical transmissivity in the wavelength of 193 nm. Therefore, the resin of formula 4 cannot be used for the ArF lithography process:

SUMMARY OF THE INVENTION

Accordingly, it is an object of the present invention to provide photoresist polymers which can be employed as ArF photoresists and methods for preparing the same.

Another object of the present invention is to provide photoresist compositions comprising such PR polymers.

Still another object of the present invention is to provide a semiconductor device produced by using the above described PR composition.

DETAILED DESCRIPTION OF THE PREFERRED EMBODIMENTS

The present invention provides novel photoresist polymers and a process for preparing the same, which achieve the above-stated objectives. The present invention also provides for a photoresist composition comprising such PR polymers and a semiconductor device fabricated by using such PR compositions.

In one particular aspect, the present invention provides a photoresist polymer comprising polycarbonates of the formula 1:

wherein,

AC1 and AC2 are independently alicyclic groups; and x and y represent the relative amount of each monomer, wherein the ratio of x:y=0–100 mol %: 100–0 mol % (i.e., the sum of x and y is 100 mol %).

It should be appreciated that the order of each monomeric units represented in a polymer formula of the present invention does not necessarily indicate the actual order of such monomeric units in the actual polymer. The monomeric units represented in the polymer formula is simply intended to indicate the presence of-such monomeric unit in the polymer, i.e., when the variable x or y is not 0. Moreover, the variables x and y represent a total relative ratio of each unit. For example, the total amount "x" of polymeric units comprising AC1 moiety may be inter dispersed throughout the polymer (not necessarily in same concentrations) or all or majority of such polymeric unit may be concentrated in one particular location of the polymer.

The alicyclic groups of AC1 and AC2 are preferably ($C_5$–$C_{20}$) mono-, bi-, tri- or tetra-cyclic groups. The alicyclic groups are more preferably selected from the group consisting of cyclopentyl, cyclohexyl, cyclooctyl, decalinyl, norbornyl and isopropylidene dicyclohexyl.

Examples of preferred polymers of the present invention include, but are not limited to:

19

20

21

22

23

24

25

26

27

28

29

30

31

32

33

34

35

36

37

-continued wherein, x:y=0–100 mol %: 100–0 mol %.

The molecular weight of the present photoresist polymer is preferably from about 3,000 to about 100,000, more preferably from about 3,000 to about 50,000. That is, a degree of polymerization of the present photoresist polymer is preferably from about 20 to about 350.

The photoresist polymer of the present invention can be prepared by a variety of methods. An exemplary procedure for preparing polymers of the present invention includes the steps of:

(a) reacting cycloalkanediol of formula 39a with p-nitrophenylchloroformate of formula 40, preferably in an organic solvent, to produce a compound of formula 41;

(b) reacting the compound of formula 41 with a cycloalkanediol of formula 39b, preferably in an organic solvent; and (c) heating the product of step (b) in inert atmosphere to form the polymer of formula 1:

39a

39b

40

41 wherein, AC1 and AC2 are those defined above.

Reaction Scheme 1, shown below, summarized the above described process:

The compounds of formulas 39a and 39b may be identical or different, and are preferably selected from the group consisting of compounds of formulas 39c to 39l. 1,4-cyclohexaniediol:

39c

1,3-cyclohexanediol:

39d

1,2-cyclohexanediol:

39e

1,2-cyclopentanediol:

39f 1,3-cyclopentanediol:

39g

1,2-cyclooctanediol:

39h 1,2-cyclooctanediol:

39i 4,4'-isopropylidene dicyclohexanol:

39j 1,5-decalinediol:

39k 2,3-norbornanediol:

39l

Preferably, the organic solvent for polymerization is selected from the group consisting of tetrahydrofuran, dichloromethane, chloroform, cyclohexanone, dimethylformamide, dimethylsulfoxide, dioxane, methyl ethyl ketone, benzene, toluene and xylene.

Preferably, the inert atmosphere is either nitrogen or argon atmosphere.

Another exemplary procedure for preparing polymers of the present invention includes the steps of:

(a) dissolving at least one compound selected from the compounds of formulas 39a and 39b in an organic solvent; and (b) adding a compound selected from phosgene (formula 42a), diphosgene (formula 42b) and triphosgene (formula 42c) into the resultant solution, and reacting the resultant solution to form the polymer of formula 1:

42a

42b

42c

Again, the compounds of formulas 39a and 39b used in the second preparation process may be identical or different, and are preferably selected from the group consisting of the above compounds of formulas 39c to 39l.

In addition, the organic solvent for polymerization is preferably selected from the group consisting of tetrahydrofuran, dichloromethane, chloroform, cyclohexanone, dimethylformamide, dimethylsulfoxide, dioxane, methyl ethyl ketone, benzene, toluene and xylene.

The present invention provides a photoresist composition comprising a photoresist polymer described herein, an organic solvent and a photoacid generator.

Preferred photoacid generators include sulfide or onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate. Typically the amount of photoacid generator is from about 0.01% by weight to about 10% by weight of the photoresist resin employed.

The organic solvent suitable in PR composition is preferably selected from the group consisting of propylene glycol methyl ether acetate, propylene glycol methyl ether, ethyl lactate, methyl 3-methoxypropionate, ethyl 3-ethoxypropionate and cyclohexanone. The amount of solvent used is preferably in the range of from about 100% to about 1000% by weight of the PR polymer. This ratio has been found to be particularly useful in obtaining a photoresist layer of desirable thickness when coated on to a suitable substrate such as a silicon wafer in production of a semiconductor element. In particular, it has been found by the present inventors that when the amount of organic solvent is about 400% and 500% by weight of the PR polymer, a PR layer having respectively 0.4 $\mu$m and 0.5 $\mu$m of thickness can be obtained.

Another aspect of the present invention provides a process for forming a photoresist pattern comprising the steps of:

(a) coating a photoresist composition described above on a substrate of a semiconductor element to form a photoresist film;

(b) exposing the photoresist film to light using a light source; and (c) baking the exposed photoresist film.

The process for forming the photoresist pattern can further include a developing step after the baking step (c). However, the photoresist compositions of the present invention also provide an excellent pattern formation without the developing step.

In another embodiment of the present invention, the process for forming the photoresist pattern can further include a baking step before the exposure of step (b). Preferably, the baking step is performed at temperature in the range of from about 70 to about 200° C.

Exemplary light sources which are useful for forming the PR pattern include ArF, KrF, EUV, VUV, E-beam, X-ray and ion beam. Preferably, the irradiation energy is in the range of from about 1 mJ/cm$^2$ to about 100 mJ/cm$^2$.

The present invention also provides a semiconductor device, which is manufactured using the photoresist composition described above.

Additional objects, advantages, and novel features of this invention will become apparent to those skilled in the art upon examination of the following examples thereof, which are not intended to be limiting.

I. PREPARATION OF PHOTORESIST POLYMER

As described above, there are at least two different processes for preparing the photoresist polymer of formula

1. Thus, the examples will be also described in accordance with each preparation process.
(1) First Preparation Process In a Preparation Example, a preparation process for the compound of formula 41 which is an intermediate product in the first preparation process is described.

PREPARATION EXAMPLE 1

Synthesis of 1,4-Cyclohexanediol bis-p-nitrophenylcarbonate

To 100 mL of dichloromethane was added 3.48 g of 1,4-cyclohexanediol and 4.74 g of pyridine. The mixture was stirred about 30 minutes, and a solution of 12.1 g of p-nitrophenylchloroformate in 30 mL of dichloromethane was slowly added over one hour period. The resulting solution was washed successively with water (2×100 mL), 5% aqueous hydrochloric acid solution (1×50 mL), and again with water (1×100 mL). Thereafter, the organic layer was dried over magnesium sulfate, and the solvent was removed under reduced pressure. The residue was recrystallized in dichloromethane and petroleum ether to obtain the compound of the following structure (7.80 g, yield: 70%):

PREPARATION EXAMPLE 2

Synthesis of 1,3-Cyclohexanediol bis-p-nitrophenylcarbonate

The procedure of Preparation Example 1 was repeated except 3.48 g of 1,3-cyclohexanediol was used instead of 1,4-cyclohexanediol to obtain the compound of the following structure (7.1 g, yield: 63%):

PREPARATION EXAMPLE 3

Synthesis of 1,2-Cyclohexanediol bis-p-nitrophenylcarbonate

The procedure of Preparation Example 1 was repeated except 3.48 g of 1,2-cyclohexanediol was used instead of 1,4-cyclohexanediol to obtain the compound of the following structure (6.2 g, yield: 55%):

PREPARATION EXAMPLE 4

Synthesis of 4,4'-Isopropylidene dicyclohexanol bis-p-nitrophenylcarbonate

The procedure of Preparation Example 1 was repeated except 7.2 g of 4,4'-isopropylidene dicyclohexanol was used instead of 1,4-cyclohexanediol to obtain the compound of the following structure (17.5 g, yield: 75%):

PREPARATION EXAMPLE 5

Synthesis of 1,5-Decalinediol bis-p-nitrophenylcarbonate

The procedure of Preparation Example 1 was repeated except 5.11 g of 1,5-decalinediol was used instead of 1,4-cyclohexanediol to obtain the compound of the following structure (10.75 g, yield: 65%):

PREPARATION EXAMPLE 6

Synthesis of 1,3-Cylcopentanediol bis-p-nitrophenylcarbonate

The procedure of Preparation Example 1 was repeated except 3.06 g of 1,3-cyclopentanediol was used instead of 1,4-cyclohexanediol to obtain the compound of the following structure (5.9 g, yield: 60%):

PREPARATION EXAMPLE 7

Synthesis of 1,2-Cylcopentanediol bis-p-nitrophenylcarbonate

The procedure of Preparation Example 1 was repeated except 3.06 g of 1,2-cyclopentanediol was used instead of 1,4-cyclohexanediol to obtain the compound of the following structure (5.1 g, yield: 52%):

PREPARATION EXAMPLE 8

Synthesis of 1,5-Cylcootanediol bis-p-nitrophenylcarbonate

The procedure of Preparation Example 1 was repeated except 4.33 g of 1,5-cyclooctanediol was used instead of 1,4-cyclohexanediol to obtain the compound of the following structure (9.80 g, yield: 70%):

PREPARATION EXAMPLE 9

Synthesis of 1,2-Cylcooctanediol bis-p-nitrophenylcarbonate

The procedure of Preparation Example 1 was repeated except 4.33 g of 1,2-cyclooctanediol was used instead of 1,4-cyclohexanediol to obtain the compound of the following structure (7.0 g, yield: 50%):

PREPARATION EXAMPLE 10

Synthesis of 2,3-Norbornanediol bis-p-nitrophenylcarbonate

The procedure of Preparation Example 1 was repeated except 3.85 g of 2,3-norbornanediol was used instead of 1,4-cyclohexanediol to obtain the compound of the following structure (6.22 g, yield: 50%):

INVENTION EXAMPLE 1

To a solution of 100 mL of dichloromethane was added 13.39 g of 1,4-cyclohexanediol bis-p-nitrophenylcarbonate prepared in Preparation Example 1, 3.48 g of 1,4-cyclohexanediol, 20 g of potassium carbonate, and 1.2 g of 18-crown-6 under an argon atmosphere. The mixture was refluxed for 24 hours and diluted by adding 100 mL of dichloromethane. This suspension was centrifugally separated, and a clear solution was separated and concentrated. The concentrated residue was precipitated in methanol, filtered and dried under vacuum to obtain the polymer of formula 5 (15.18 g, yield: 90%).

INVENTION EXAMPLE 2

The procedure of Invention Example 1 was repeated except 1,3-cyclohexanediol was used instead of 1,4-cyclohexanediol to obtain the polymer of formula 6 (15.52 g, yield: 92%).

INVENTION EXAMPLE 3

The procedure of Invention Example 1 was repeated except 7.21 g of 4,4'-isopropylidene dicyclohexanol was used instead of 1,4-cyclohexanediol to obtain the polymer of formula 7 (18.54 g, yield: 90%).

INVENTION EXAMPLE 4

The procedure of Invention Example 1 was repeated except 5.11 g of 1,5-decalinediol was used instead of 1,4-cyclohexanediol to obtain the polymer of formula 8 (14.80 g, yield: 80%).

INVENTION EXAMPLE 5

The procedure of Invention Example 1 was repeated except 3.06 g of 1,3-cyclopentanediol was used instead of 1,4-cyclohexanediol to obtain the polymer of formula 9 (11.84 g, yield: 72%).

INVENTION EXAMPLE 6

The procedure of Invention Example 1 was repeated except 4.33 g of 1,5-cyclooctanediol was used instead of 1,4-cyclohexanediol to obtain the polymer of formula 10 (13.29 g, yield: 75%).

INVENTION EXAMPLE 7

The procedure of Invention Example 1 was repeated except 3.85 g of 2,3-norbornanediol was used instead of 1,4-cyclohexanediol to obtaining the polymer of formula 11 (8.62 g, yield: 50%).

INVENTION EXAMPLE 8

To 100 mL of dichloromethane was added 13.39 g of 1,2-cyclohexanediol bis-p-nitrophenylcarbonate prepared in Preparation Example 3, 3.48 g of 1,2-cyclohexanediol, 20 g of potassium carbonate, and 1.2 g of 18-crown-6 under an argon atmosphere. The mixture was refluxed for 24 hours and then diluted by adding 100 ml of dichloromethane. This suspension was centrifuged and a clear solution was separated and concentrated. The concentrated solution was precipitated in methanol, filtered and dried under vacuum to obtain the polymer of formula 12 (13.83 g, yield: 82%).

INVENTION EXAMPLE 9

The procedure of Invention Example 8 was repeated except 7.21 g of 4,4'-isopropylidene dicyclohexanol was used instead of 1,2-cyclohexanediol to obtain the polymer of formula 13 (15.45 g, yield: 75%).

INVENTION EXAMPLE 10

The procedure of Invention Example 8 was repeated except 5.11 g of 1,5-decalinediol was used instead of 1,2-cyclohexanediol to obtain the polymer of formula 14 (14.06 g, yield: 76%).

INVENTION EXAMPLE 11

The procedure of Invention Example 8 was repeated except 3.06 g of 1,3-cyclopentanediol was used instead of 1,2-cyclohexanediol to obtain the polymer of formula 15 (10.70 g, yield: 65%).

INVENTION EXAMPLE 12

The procedure of Invention Example 8 was repeated except 4.33 g of 1,5-cyclooctanediol was used instead of 1,2-cyclohexanediol to obtain the polymer of formula 16 (12.05 g, yield: 68%).

INVENTION EXAMPLE 13

The procedure of Invention Example 8 was repeated except 3.85 g of 2,3-norbornanediol was used instead of 1,2-cyclohexanediol to obtain the polymer of formula 17 (8.96 g, yield: 52%).

INVENTION EXAMPLE 14

To 100 mL of dichloromethane was added 17.11 g of 4,4'-isopropylidene dicyclohexanol bis-p-nitrophenylcarbonate prepared in Preparation Example 4, 7.21 g of 4,4'-isopropylidene dicyclohexanol, 20 g of potassium carbonate, and 1.2 g of 18-crown-6 under an argon atmosphere. The mixture was refluxed for 24 hours and then diluted by adding 100 ml of dichloromethane. This suspension was centrifuged, and a clear solution was separated and concentrated. The concentrated residue was precipitated in methanol, filtered and dried under vacuum to obtain the polymer of formula 18 (22.86 g, yield: 94%).

INVENTION EXAMPLE 15

The procedure of Invention Example 14 was repeated except 5.11 g of 1,5-decalinediol was used instead of 4,4'-isopropylidene dicyclohexanol to obtain the polymer of formula 19 (19.10 g, yield: 86%).

INVENTION EXAMPLE 16

The procedure of Invention Example 14 was repeated except 3.06 g of 1,3-cyclopentanediol was used instead of 4,4'-isopropylidene dicyclohexanol to obtain the polymer of formula 20 (14.52 g, yield: 72%).

INVENTION EXAMPLE 17

The procedure of Invention Example 14 was repeated except 4.33 g of 1,5-cyclooctanediol was used instead of 4,4'-isopropylidene dicyclohexanol to obtain the polymer of formula 21 (16.51 g, yield: 77%).

INVENTION EXAMPLE 18

The procedure of Invention Example 14 was repeated except 3.85 g of 2,3-norbornanediol was used instead of 4,4'-isopropylidene dicyclohexanol to obtain the polymer of formula 22 (12.78 g, yield: 61%).

INVENTION EXAMPLE 19

To 100 mL of dichloromethane was added 15.01 g of 1,5-decalinediol bis-p-nitrophenylcarbonate prepared in Preparation Example 5, 5.11 g of 1,5-decalinediol, 20 g of potassium carbonate, and 1.2 g of 18-crown-6 under an argon atmosphere. The mixture was refluxed for 24 hours and then diluted with 100 ml of dichloromethane. This suspension was centrifuged, and a clear solution was separated and concentrated. The concentrated solution was precipitated in methanol, filtered and dried under vacuum to obtain the polymer of formula 23 (18.91 g, yield: 94%).

INVENTION EXAMPLE 20

The procedure of Invention Example 19 was repeated except 3.06 g of 1,3-cyclopentanediol was used instead of 1,5-decalinediol to obtain the polymer of formula 24 (14.09 g, yield: 78%).

INVENTION EXAMPLE 21

The procedure of Invention Example 19 was repeated except 4.33 g of 1,5-cyclooctanediol was used instead of 1,5-decalinediol to obtain the polymer of formula 25 (16.05 g, yield: 83%).

INVENTION EXAMPLE 22

The procedure of Invention Example 19 was repeated except 3.85 g of 2,3-norbornanediol was used instead of 1,5-decalinediol to obtain the polymer of formula 26 (10.94 g, yield: 58%).

INVENTION EXAMPLE 23

To 100 mL of dichloromethane was added 12.97 g of 1,3-cylcopentanediol bis-p-nitrophenylcarbonate prepared in Preparation Example 6, 3.06 g of 1,3-cyclopentanediol, 20 g of potassium carbonate, and 1.2 g of 18-crown-6 under an argon atmosphere. The mixture was refluxed for 24 hours and then diluted with 100 ml of dichloromethane. This resulting suspension was centrifuged, and a clear solution was separated and concentrated. The concentrated solution was precipitated in methanol, filtered and dried under vacuum to obtain the polymer of formula 27 (13.62 g, yield: 85%).

INVENTION EXAMPLE 24

The procedure of Invention Example 23 was repeated except 4.33 g of 1,5-cyclooctanediol was used instead of 1,3-cylcopentanediol to obtain the polymer of formula 28 (12.8 g, yield: 74%).

INVENTION EXAMPLE 25

The procedure of Invention Example 23 was repeated except 3.85 g of 2,3-norbornanediol was used instead of 1,3-cylcopentanediol to obtain the polymer of formula 29 (8.75 g, yield: 52%).

INVENTION EXAMPLE 26

To 100 mL of dichloromethane was added 14.23 g of 1,5-cylcootanediol bis-p-nitrophenylcarbonate prepared in Preparation Example 8, 4.33 g of 1,5-cylcootanediol, 20 g of potassium carbonate, and 1.2 g of 18-crown-6 under an argon atmosphere. The mixture was refluxed for 24 hours and then diluted with 100 ml of dichloromethane. This resulting suspension was centrifuged, and a clear solution was separated and concentrated. The concentrated solution was precipitated in methanol, filtered and dried under vacuum to obtain the polymer of formula 30 (16.89 g, yield: 91%).

INVENTION EXAMPLE 27

The procedure of Invention Example 26 was repeated except 3.85 g of 2,3-norbornanediol was used instead of 1,5-cylcootanediol to obtain the polymer of formula 31 (9.94 g, yield: 55%).

INVENTION EXAMPLE 28

To 100 mL of dichloromethane was added 13.75 g of 2,3-norbornanediol bis-p-nitrophenylcarbonate prepared in Preparation Example 10, 3.85 g of 2,3-norbornanediol, 20 g of potassium carbonate, and 1.2 g of 18-crown-6 under an argon atmosphere. The mixture was refluxed for 24 hours and then diluted with 100 ml of dichloromethane. The resulting suspension was centrifuged, and a fine solution was separated and concentrated. The concentrated solution was precipitated in methanol, filtered and dried under vacuum to obtain the polymer of formula 32 (11.10 g, yield: 63%).

(2) Second Preparation Process

INVENTION EXAMPLE 29

To 250 mL of dichloromethane was added 116.16 g of 1,4-cyclohexanediol and 121.43 g of triethylamine, and the mixture was cooled to −10° C. A solution of 98.915 g of diphosgene (formula 42b) in 10 ml of dichloromethane was slowly added to the cooled solution. The reaction mixture was stirred at room temperature for 12 hours. A generated salt was removed, and the resultant solution was precipitated in methanol. The precipitate was filtered, washed with methanol three times, and dried under vacuum to obtain the polymer of formula 5 (120.83 g, yield: 85%).

INVENTION EXAMPLE 30

The procedure of Invention Example 29 was repeated except 116.16 g of 1,3-cyclohexanediol was used instead of 1,4-cyclohexanediol to obtain the polymer of formula 33 (113.7 g, yield: 80%).

INVENTION EXAMPLE 31

The procedure of Invention Example 29 was repeated except 116.16 g of 1,2-cyclohexanediol was used instead of 1,4-cyclohexanediol to obtain the polymer of formula 12 (85.29 g, yield: 60%).

INVENTION EXAMPLE 32

The procedure of Invention Example 29 was repeated except 102.13 g of 1,3-cyclopentanediol was used instead of 1,4-cyclohexanediol to obtain the polymer of formula 27 (66.38 g, yield: 65%).

INVENTION EXAMPLE 33

The procedure of Invention Example 29 was repeated except 102.13 g of 1,2-cyclopentanediol was used instead of 1,4-cyclohexanediol to obtain the polymer of formula 34 (68 g, yield: 48%).

INVENTION EXAMPLE 34

The procedure of Invention Example 29 was repeated except 144.21 g of 1,5-cyclooctanediol was used instead of 1,4-cyclohexanediol to obtain the polymer of formula 30 (138.2 g, yield: 75%).

INVENTION EXAMPLE 35

The procedure of Invention Example 29 was repeated except 144.21 g of 1,2-clooctanediol was used instead of 1,4-cyclohexanediol to obtain the polymer of formula 35 (101.33 g, yield: 55%).

INVENTION EXAMPLE 36

The procedure of Invention Example 29 was repeated except 128.2 g of 2,3-norbornanediol was used instead of 1,4-cyclohexanediol to obtain the polymer of formula 32 (75.7 g, yield: 45%).

INVENTION EXAMPLE 37

The procedure of Invention Example 29 was repeated except 170.25 g of 1,5-decalinediol was used instead of 1,4-cyclohexanediol to obtain the polymer of formula 23 (158.8 g, yield: 78%).

INVENTION EXAMPLE 38

The procedure of Invention Example 29 was repeated using 58.1 g of 1,4-cyclohexanediol and 58.1 g of 1,3-cyclohexylcarbonate to obtain the polymer of formula 6 (125 g, yield: 80%).

INVENTION EXAMPLE 39

The procedure of Invention Example 29 was repeated using 58.1 g of 1,4-cyclohexanediol and 51.1 g of 1,3-cyclopentylcarbonate to obtain the polymer of formula 9 (78.6 g, yield: 72%).

INVENTION EXAMPLE 40

The procedure of Invention Example 29 was repeated using 58.1 g of 1,4-cyclohexanediol and 72.1 g of 1,5-cyclooctylcarbonate to obtain the polymer of formula 10 (83.3 g, yield: 64%).

INVENTION EXAMPLE 41

The procedure of Invention Example 29 was repeated using 58.1 g of 1,4-cyclohexanediol and 85.12 g of 1,5-decalinylcarbonate to obtain the polymer of formula 8 (107.4 g, yield: 75%).

INVENTION EXAMPLE 42

The procedure of Invention Example 29 was repeated using 58.1 g of 1,3-cyclohexanediol and 51.1 g of 1,3-cyclopentylcarbonate to obtain the polymer of formula 36 (67.7 g, yield: 62%).

INVENTION EXAMPLE 43

The procedure of Invention Example 29 was repeated using 58.1 g of 1,3-cyclohexanediol and 72.1 g of 1,5-cyclooctylcarbonate to obtain the polymer of formula 37 (92.2 g, yield: 71%).

INVENTION EXAMPLE 44

The procedure of Invention Example 29 was repeated using 58.1 g of 1,3-cyclohexanediol and 85.12 g of 1,5-decalinylcarbonate to obtain the polymer of formula 38 (85.9 g, yield: 60%).

INVENTION EXAMPLE 45

The procedure of Invention Example 29 was repeated using 51.1 g of 1,3-cyclopentanediol and 72.1 g of 1,5-cyclooctylcarbonate to obtain the polymer of formula 28 (92.4 g, yield: 75%).

INVENTION EXAMPLE 46

The procedure of Invention Example 29 was repeated using 51.1 g of 1,3-cyclopentanediol and 85.12 g of 1,5-decalinylcarbonate to obtain the polymer of formula 24 (102.2 g, yield: 75%).

INVENTION EXAMPLE 47

The procedure of Invention Example 29 was repeated using 72.1 g of 1,5-cyclooctanediol and 85.12 g of 1,5-decalinylcarbonate to obtain the polymer of formula 25 (107 g, yield: 68%).

II. PREPARATION OF PHOTORESIST COMPOSITION AND FORMATION OF PATTERN

INVENTION EXAMPLE 48

To 50 g of propyleneglycol methyl ether acetate was added 10 g of the polymer prepared in Invention Example 1, and 0.2 g of triphenylsulfonium triflate as a photoacid generator. The resulting mixture was stirred and filtered through a 0.1 μm filter to prepare a photoresist composition.

Figure 1:
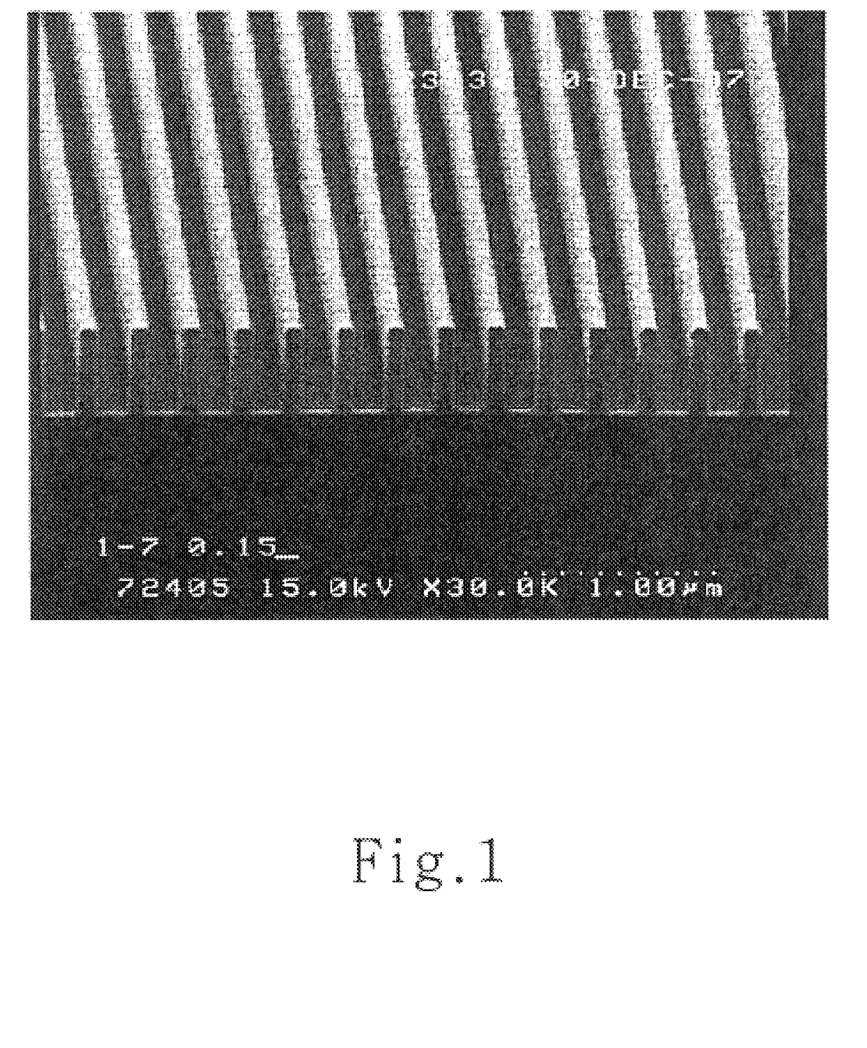
FIG. 1 shows a photoresist pattern obtained in Example 1.

The photoresist composition thus prepared was spin-coated on a silicon wafer, and soft-baked in an oven or hot plate of 120° C. for 90 seconds. After baking, the photoresist was exposed to light using an ArF laser exposer, and then post-baked at 120° C. for 90 seconds. When the post-baking was completed, it was developed in 2.38 wt % aqueous TMAH (tetramethylammonium hydroxide) solution for 40 seconds to obtain a 0.15 μm L/S pattern (See FIG. 1).

INVENTION EXAMPLES 49 TO 75

The procedure of Invention Example 48 was repeated except the polymers of Invention Examples 2 to 28, respectively, were used instead of the polymer prepared in Invention Example 1 to form corresponding photoresist compositions.

Photoresist patterns were formed by employing these photoresist compositions.

INVENTION EXAMPLE 76

To 40 g of ethyl lactate was added 10 g of the polymer prepared in Invention Example 29, and 0.2 g of triphenyl-sulfonium triflate as a photoacid generator. The resulting mixture was stirred and filtered through a 0.1 μm filter to prepare a photoresist composition.

The photoresist composition thus prepared was spin-coated on a silicon wafer, and soft-baked in an oven or hot plate of 100° C. for 90 seconds. After baking, the photoresist was exposed to light using an ArF laser exposer, and then post-baked at 120° C. for 90 seconds. When the post-baking was completed, 0.15 μm L/S pattern was obtained without developing process.

INVENTION EXAMPLES 77 TO 94

The procedure of Invention Example 76 was repeated except the polymers of Invention Examples 30 to 47, respectively, were used instead of the polymer prepared in Invention Example 29 to form corresponding photoresist compositions.

Photoresist patterns were formed by employing these photoresist compositions.

As discussed earlier, the photoresist polymer of the present invention is a secondary or tertiary polycarbonate resin having cycloalkanes in a main chain. Since polymers of the present invention do not comprise aromatic rings, transmission of light is high at 193 nm wavelength and etching resistance is excellent. In addition, polymers of the present invention have high thermal stability required for the photolithography process, and also have sufficient sensitivity to be used as a chemical amplification type resist.

Moreover, photoresist polymers of the present invention can form an excellent pattern in the heating step after the exposure, without a wet developing step (e.g., using 2.38wt % aqueous TMAH solution). As a result, the whole process can be simplified, the cost can be reduced, and the throughput can be increased.

What is claimed is:

1. The photoresist polymer selected from the group consisting of polymers of formulas 5–17 to 19–38:

-continued wherein, x and y are total relative ratio of each monomeric unit and x and y are not 0.

2. The photoresist polymer according to claim 1, wherein the molecular weight of said polymer is about 3,000 to about 100,000.

3. A process for preparing the photoresist polymer of claim 1, comprising the steps of:
  (a) preparing a compound of formula 41 by reacting cycloalkanediol of formula 39a with p-nitrophenylchloroformate of formula 40;
  (b) reacting the compound of formula 41 with cycloalkanediol of formula 39b; and
  (c) heating the product of step (b) in inert atmosphere to form said polymer of claim 1:

wherein
AC1 and AC2 are appropriate alicyclic groups in polymers of formulas 5–17 to 19–38.

4. The process according to claim 3, wherein each of the compounds of formulas 39a and 39b is independently selected from the group consisting of 1,4-cyclohexanediol, 1,3-cyclohexanediol, 1,2-cyclohexanediol, 1,2-cyclopentanediol, 1,3-cyclopentanediol, 1,2-cyclooctanediol, 1,2-cyclooctanediol, 4,4'-isopropylidene dicyclohexanol, 1,5-decalinediol and 2,3-norbornanediol.

5. The process according to claim 3, wherein said steps (a) and (b) further comprise an organic solvent selected from the group consisting of tetrahydrofuran, dichloromethane, chloroform, cyclohexanone, dimethylformamide, dimethylsulfoxide, dioxane, methyl ethyl ketone, benzene, toluene and xylene.

6. A process for preparing the photoresist polymer of claim 1, comprising the steps of:
  (a) dissolving at least one compound selected from the compounds of Formulas 39a and 39b in an organic solvent; and
  (b) adding a compound selected from phosgene, diphosgene and triphosgene into the resultant solution under conditions sufficient to produce said photoresist polymer of claim 1:

wherein
AC1 and AC2 are appropriate alicyclic groups in polymers of formulas 5–17 to 19–38.

7. The process according to claim 6, wherein each of the compounds of formulas 39a and 39b is independently selected from the group consisting of 1,4-cyclohexanediol, 1,3-cyclohexanediol, 1,2-cyclohexanediol, 1,2-cyclopentanediol, 1,3-cyclopentanediol, 1,2-cyclooctanediol, 1,2-cyclooctanediol, 4,4'-isopropylidene dicyclohexanol, 1,5-decalinediol and 2,3-norbornanediol.

8. The process according to claim 6, wherein said organic solvent is selected from the group consisting of tetrahydrofuran, dichloromethane, chloroform, cyclohexanone, dimethylformamide, dimethylsulfoxide, dioxane, methyl ethyl ketone, benzene, toluene and xylene.

9. A photoresist composition comprising (i) a photoresist polymer of claim 1, (ii) an organic solvent and (iii) a photoacid generator.

10. The photoresist composition according to claim 9, wherein said photoacid generator is a sulfide or onium type compound.

11. The photoresist composition according to claim 9, wherein said photoacid generator comprises one or more compounds selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, and a mixture thereof.

12. The photoresist composition according to claim 9, wherein the amount of said photoacid generator is in the range of from about 0.01 to about 10% by weight of said photoresist polymer.

13. The photoresist composition according to claim 9, wherein said organic solvent is selected from the group consisting of propylene glycol methyl ether acetate, propylene glycol methyl ether, ethyl lactate, methyl 3-methoxypropionate, ethyl 3-ethoxypropionate and cyclohexanone.

14. The photoresist composition according to claim 9, wherein the amount of said organic solvent is in the range of from about 100 to about 1000% by weight of said photoresist polymer.

15. A process for forming a photoresist pattern, comprising the steps of: (a) coating said photoresist composition of claim 9 on a substrate of semiconductor device to form a photoresist film; (b) exposing said photoresist film to light using a light source; and (c) baking said exposed photoresist film.

16. The process according to claim 15, further comprising a developing step after the baking step (c).

17. The process according to claim 16, wherein said developing step is performed by using 2.38 wt % aqueous tetramethylammonium hydroxide (TMAH) solution.

18. The process according to claim 15, further comprising a baking step before exposure of step (b).

19. The process according to claim 15 or 18, wherein said baking step is performed at 70 to 200° C.

20. The process according to claim 15, wherein said light source is ArF.

21. The process according to claim 15, wherein said photoresist film is irradiated with from about 1 mJ/cm$^2$ to about 100 mJ/cm$^2$ of light-exposure energy.

22. A semiconductor device manufactured by the process of claim 15.

* * * * *